United States Patent
Sun

(10) Patent No.: US 9,445,533 B2
(45) Date of Patent: Sep. 13, 2016

(54) ELECTRONIC COMPONENT CASE FOR VEHICLE

(71) Applicant: LSIS CO., LTD., Anyang-si, Gyeonggi-do (KR)

(72) Inventor: Jong In Sun, Incheon-si (KR)

(73) Assignee: LSIS CO., LTD., Anyang-si (KR)

( * ) Notice: Subject to any disclaimer, the term of this patent is extended or adjusted under 35 U.S.C. 154(b) by 59 days.

(21) Appl. No.: 14/546,425

(22) Filed: Nov. 18, 2014

(65) Prior Publication Data

US 2015/0271956 A1 Sep. 24, 2015

(30) Foreign Application Priority Data

Mar. 21, 2014 (KR) .......................... 10-2014-0033485

(51) Int. Cl.
*H05K 7/20* (2006.01)
*H01L 23/473* (2006.01)

(52) U.S. Cl.
CPC ................................ *H05K 7/20927* (2013.01)

(58) Field of Classification Search
CPC .............................. G06F 1/181–1/182; H05K 7/20218–7/20381; H05K 7/20409–7/20418; H05K 7/20009–7/202; H01L 23/367–23/3677; H01L 23/46–23/467; H01L 23/473
USPC .......................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| 4,930,570 A | * | 6/1990 | Okayasu ............ H05K 7/20636 165/104.14 |
| 2004/0070940 A1 | * | 4/2004 | Tomioka ................. G06F 1/203 361/699 |

(Continued)

FOREIGN PATENT DOCUMENTS

| JP | 2002-276989 | 9/2002 |
| JP | 2003-150896 | 5/2003 |

(Continued)

OTHER PUBLICATIONS

Japan Patent Office Application Serial No. 2014-253262, Office Action dated Feb. 16, 2016, 4 pages.

(Continued)

*Primary Examiner* — Anthony Haughton
*Assistant Examiner* — Razmeen Gafur
(74) *Attorney, Agent, or Firm* — Lee, Hong, Degerman, Kang & Waimey; Jonathan Kang; Richard Salfelder

(57) ABSTRACT

An electronic component case for a vehicle is provided. The electronic component case includes a case body having a first space in which electronic components are disposed and a second space, which has an opening that is opened to the outside, defined adjacent to the first space to receive heat generated from the electronic components, wherein a coolant for cooling the electronic components is introduced into and discharged from the second space, and a cover disposed on the case body to seal the opening of the second space. The cover includes a first cover sealing the opening and a second cover sealing the opening and having one surface on which a first cooling part for increasing a surface area of the second cover is disposed. The first cover and the second cover are compatible with each other.

12 Claims, 3 Drawing Sheets

(56) References Cited

U.S. PATENT DOCUMENTS

| | | | |
|---|---|---|---|
| 2005/0152101 A1* | 7/2005 | Rodriguez | H05K 7/20272 361/605 |
| 2006/0044762 A1* | 3/2006 | Kikuchi | H01L 25/162 361/704 |
| 2006/0076694 A1* | 4/2006 | Chen | H01L 23/3121 257/787 |
| 2007/0062673 A1* | 3/2007 | Olesen | F28F 3/12 165/80.4 |
| 2007/0134976 A1* | 6/2007 | Fujimoto | H01L 23/3677 439/495 |
| 2007/0159797 A1* | 7/2007 | Teneketges | H01L 23/473 361/699 |
| 2007/0230127 A1* | 10/2007 | Peugh | H01L 23/053 361/699 |
| 2007/0268671 A1* | 11/2007 | Brandenburg | H01L 23/3675 361/704 |
| 2008/0272485 A1* | 11/2008 | Myers | H01L 23/473 257/714 |
| 2009/0231811 A1* | 9/2009 | Tokuyama | H01L 23/36 361/699 |
| 2010/0226094 A1* | 9/2010 | Attlesey | H05K 7/20772 361/699 |
| 2010/0265660 A1* | 10/2010 | Nguyen | H01G 2/08 361/696 |
| 2011/0069455 A1* | 3/2011 | Tokuyama | H01L 23/473 361/702 |
| 2011/0188204 A1* | 8/2011 | Horiuchi | H01L 23/473 361/702 |
| 2011/0192568 A1 | 8/2011 | Hsieh et al. | |
| 2011/0222246 A1* | 9/2011 | Hsieh | H05K 7/205 361/720 |
| 2011/0299244 A1* | 12/2011 | Dede | F28F 3/046 361/689 |
| 2011/0299265 A1* | 12/2011 | Nakatsu | B60L 11/14 361/820 |
| 2011/0310585 A1* | 12/2011 | Suwa | H05K 7/2089 361/820 |
| 2012/0057302 A1* | 3/2012 | Wei | H05K 7/20781 361/699 |
| 2012/0320529 A1* | 12/2012 | Loong | H01L 23/3735 361/702 |
| 2013/0206370 A1* | 8/2013 | Smalen | H05K 7/20254 165/104.26 |
| 2013/0279114 A1* | 10/2013 | Nishikimi | B60K 6/28 361/699 |
| 2013/0301328 A1* | 11/2013 | Ito | H05K 7/20254 363/141 |

FOREIGN PATENT DOCUMENTS

| | | |
|---|---|---|
| JP | 2009-135477 | 6/2009 |
| JP | 2014-017479 | 1/2014 |
| KR | 10-2014-0006392 | 1/2014 |

OTHER PUBLICATIONS

European Patent Office Application Serial No. 14197381.8, Search Report dated Aug. 18, 2015, 7 pages.

Japan Patent Office Application Serial No. 2014-253262, Office Action dated Aug. 11, 2015, 2 pages.

* cited by examiner

ELECTRONIC COMPONENT CASE FOR VEHICLE

CROSS-REFERENCE TO RELATED APPLICATIONS

Pursuant to 35 U.S.C. §119(a), this application claims the benefit of earlier filing date and right of priority to Korean Patent Application No. 10-2014-0033485, filed on Mar. 21, 2014, the contents of which are all hereby incorporated by reference herein in its entirety.

BACKGROUND

The present disclosure relates to an electronic component case for a vehicle, and more particularly, to an electronic component case that is capable of releasing heat generated from electronic components.

In recent years, technologies with respect to electric vehicles driven by using electricity are being rapidly developed.

Most of electric vehicles include a motor generating a rotation force, a battery supplying a power into the motor, an inverter controlling an RPM of the motor, a battery charger charging the battery by using electricity, and electronic components such as a low voltage DC/DC converter for vehicles.

Such an electronic component generates heat during the operation thereof as well as generates electromagnetic waves affecting operations of other electronic components or noises.

To solve these limitations, studies are being actively conducted on an electronic component case having an air-cooling type or water-cooling type heat dissipation structure and a shielding function for shielding electromagnetic interference (EMI) electromagnetic waves to satisfy electro magnetic compatibility (EMC).

Here, the air-cooling type heat dissipation structure means a heat dissipation structure in which electronic components are cooled by using air, and the water-cooling type heat dissipation structure means a heat dissipation structure in which a coolant is circulated to cool electronic components.

However, since the air-cooling type heat dissipation structure and the water-cooling type heat dissipation structure according to the related art are different in cooling method from each other, they are not compatible with each other.

For example, if the heat dissipation method for electronic components required for electronic vehicles is changed from the air-cooling type into the water-cooling type, a water nipple has to be separately installed, and also, an electronic component case considering an amount of heat generated from the electronic components has to be re-designed.

SUMMARY

Embodiments provide an electronic component case for vehicles, which is capable of separately or simultaneously applying a water-cooling method for cooling electronic components by using a coolant and an air-cooling method for cooling the electronic components by using air.

In one embodiment, an electronic component case for a vehicle includes: a case body having a first space in which electronic components are disposed and a second space, which has an opening that is opened to the outside, defined adjacent to the first space to receive heat generated from the electronic components, wherein a coolant for cooling the electronic components is introduced into and discharged from the second space; and a cover disposed on the case body to seal the opening of the second space, wherein the cover includes a first cover sealing the opening and a second cover sealing the opening and having one surface on which a first cooling part for increasing a surface area of the second cover is disposed, wherein the first cover and the second cover are compatible with each other.

The cover may be formed of aluminum or iron.

The case body may have a coolant inflow hole through which the coolant is introduced into the second space and a coolant discharge hole through which the coolant is discharged from the second space.

The electronic component case may further include a stopper inserted into each of the coolant inflow hole and the coolant discharge hole to seal the second space from the outside when the second cover is disposed on the case body.

The second space may be filled with the coolant.

The electronic component case may further include a first sealer provided on an edge of the cover and compressed by the case body when the cover is disposed on the case body.

The first and second spaces may be partitioned by an inner plate on which the electronic components are seated.

A second cooling part may be disposed on a surface of the inner plate that faces the second space.

When the second cover is disposed on the case body, a surface of the second cover that faces the second space may be in contact with the inner plate.

Thermal grease may be applied to a portion of the second cover of which the surface is in contact with the inner plate.

The details of one or more embodiments are set forth in the accompanying drawings and the description below. Other features will be apparent from the description and drawings, and from the claims.

DETAILED DESCRIPTION OF THE EMBODIMENTS

Figure 1:
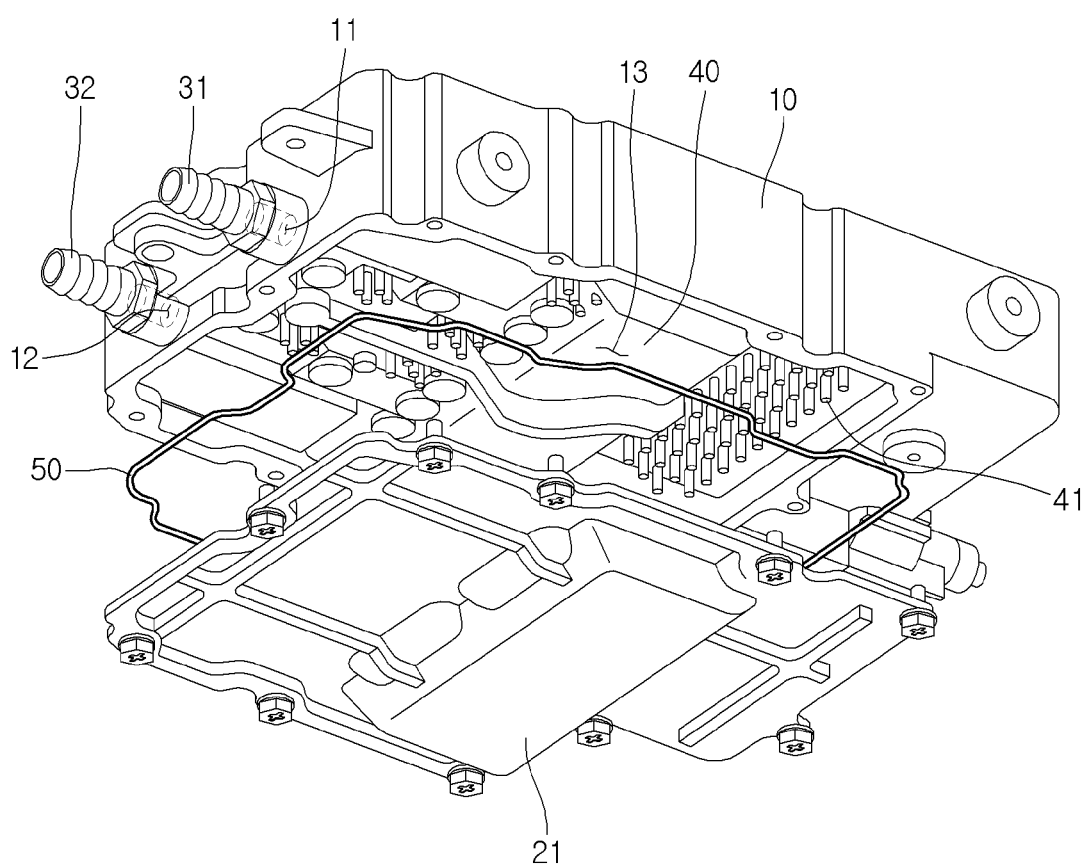
FIGS. 1 and 2 are perspective views of an electronic component case for a vehicle according to an embodiment.

Exemplary embodiments of the present disclosure will be described below in more detail with reference to the accompanying drawings. It is also noted that like reference numerals denote like elements in appreciating the drawings even though the same elements are displayed on other drawings. Moreover, detailed descriptions related to well-known functions or configurations will be ruled out in order not to unnecessarily obscure subject matters of the present disclosure.

Also, in descriptions of the elements, terms "a first", "a second", etc and reference symbols "A", "B", "(a)", "(b)", etc may be used. These terms and reference symbols are used only to differentiate one element from the other element. Thus, the order of the elements corresponding to the terms and reference symbols given in the description is not limited thereto. In the following description, it will be understood that when an element is referred to as being "connected", "coupled", or "contact" another element, it can be directly connected or contact, or intervening elements may be also be "connected", "coupled" or "contact" between the elements.

Hereinafter, an electronic component case for a vehicle according to an embodiment is described with reference to the accompanying drawings.

Figure 2:
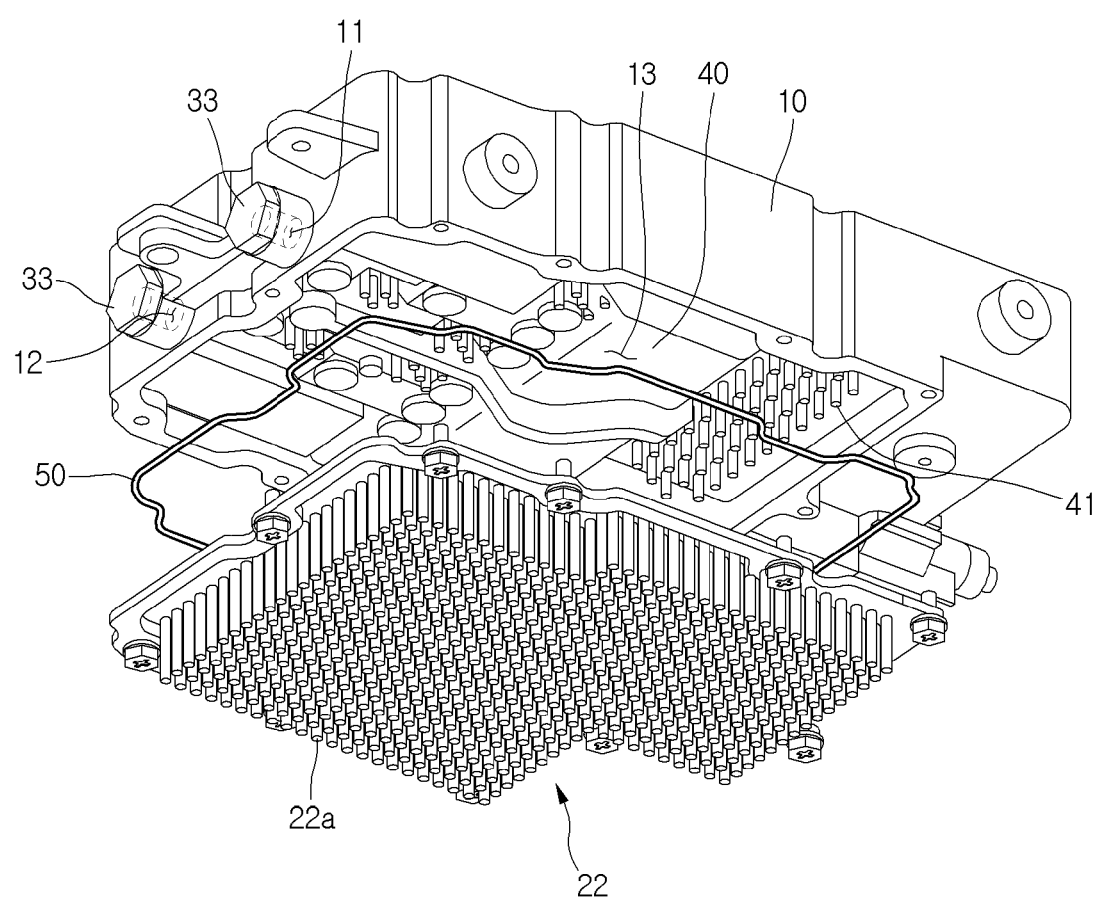
Figure 3:
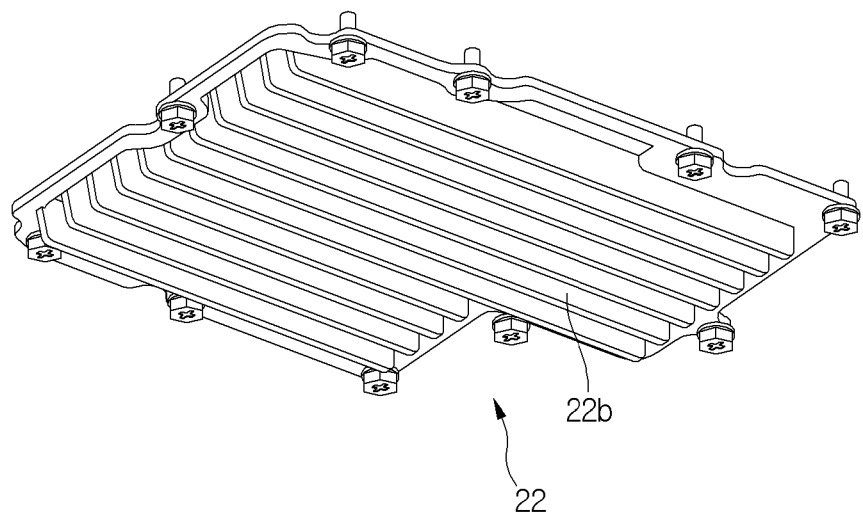
FIG. 3 is a perspective view illustrating a second cover of an electronic component case for a vehicle according to another embodiment.
Figure 4:
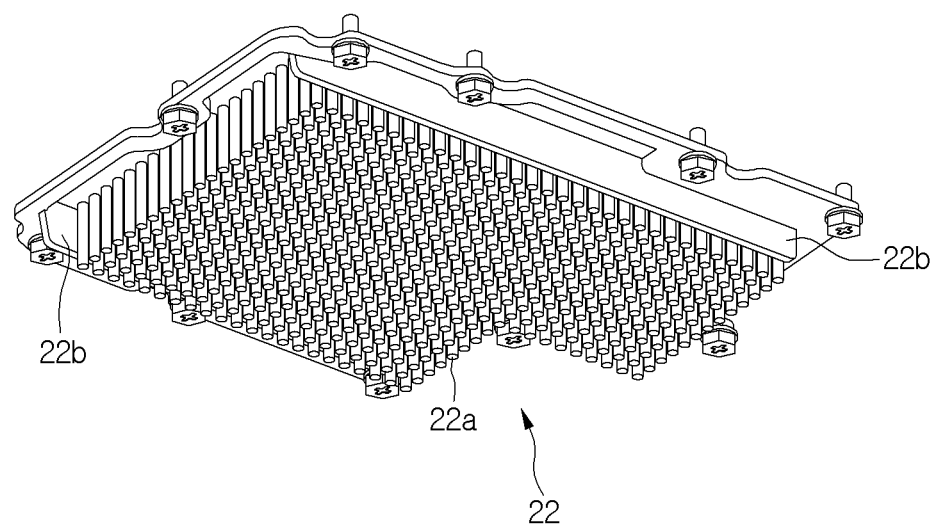
FIG. 4 is a perspective view illustrating a second cover of an electronic component case for a vehicle according to another embodiment.

FIGS. 1 and 2 are perspective views of an electronic component case for a vehicle according to an embodiment, FIG. 3 is a perspective view illustrating a second cover of an electronic component case for a vehicle according to another embodiment, and FIG. 4 is a perspective view illustrating a second cover of an electronic component case for a vehicle according to another embodiment.

Referring to FIGS. 1 to 4, the electronic component case for the vehicle includes a case body 10 and covers 21 and 22.

The case body 10 has a first space (not shown) in which electronic components are disposed and a second space 13 defined adjacent to the first space (not shown) to receive heat generated from the electronic components. Also, the case body 100 has a coolant inflow hole 11 through which a coolant is introduced into the second space 13 and a coolant discharge hole 12 through which the coolant is discharged from the second space 13.

The case body 10 may be molded by using a lightweight plastic material through plastic injection molding using a plastic resin. Here, the case body 10 molded by using the plastic material may be weight-competitive and cost-competitive when compared to a case where the case body 10 is molded by using an iron material or aluminum material. However, the plastic material may not effectively shield electromagnetic waves generated from the electronic components.

Therefore, the case body 10 may be molded by using an aluminum material or iron material to shield the electromagnetic waves.

The first space (not shown) and the second space 13 may be partitioned by an inner plate 40 on which the electronic components are seated. Here, the inner plate 40 may be formed of a metal material including aluminum, iron, or the like so as to effectively shield the electromagnetic waves and transfer heat, like the case body 10.

Also, a second cooling part for increasing a surface area of the inner plate is disposed on the surface of the inner plate that faces the second space to improve cooling efficiency for the electronic components.

The second cooling part 41 may include a plurality of pins.

The electronic component case for the vehicle may further include a second sealer (not shown) provided on an outer line of the inner plate 40 and compressed by the case body 10 to prevent the coolant introduced into the second space 13 from being introduced into the first space in which the electronic components are disposed.

The electronic components include a switching device including an insulated gate bipolar mode transistor (IGBT) that switches a direct current (DC) voltage to output a three-phase alternating current (AC) voltage, a DC link cap disposed on one side of a top surface of each of base covers 21 and 22 to stabilize an input voltage and reduce noises of the switching device, a power printed circuit board (PCB), and various components that are not described herein.

The covers 21 and 22 are disposed on the case body 10 to seal the second space 13. The covers 21 and 22 may be formed of a metal material such as aluminum, iron, or the like to improve heat transfer efficiency.

The covers 21 and 22 may include a first cover 21 and a second cover 22. The first cover 21 and the second cover 22 are compatible with each other. That is, the first cover 21 may be disposed on the case body 10. Alternatively, the second cover 22 may be disposed on the case body 10.

The electronic component case for the vehicle may further include a first sealer 50 provided on edges of each of the covers 21 and 22 and compressed by the case body 10 when the covers 21 and 22 are disposed on the case body 10.

First cooling parts 22a and 22b for increasing a surface area are disposed on one surface of the second cover 22 to improve cooling efficiency for the electronic components.

The first cooling parts 22a and 22b may include a plurality of pins 22a or a plurality of plates 22b.

When the first cooling parts 22a and 22b include the plurality of pins 22a, the first cooling parts 22a and 22b may increase in surface area of the first cooling parts 22a and 22b when compared to the case in which the first cooling parts 22a and 22b include the plurality of plates 22b, thereby improving heat exchange efficiency.

When the first cooling parts 22a and 22b include the plurality of plates 22b, the first cooling parts 22a and 22b may increase in strength when compared to the case in which the first cooling parts 22a and 22b include the plurality of pins 22a.

Also, the plurality of pins 22a and 22b are disposed inside the first cooling parts 22a and 22b. The plurality of plates 22b are disposed outside the plurality of pins 22a. That is, the first cooling parts 22a and 22b may include the plurality of pins 22a and the plurality of plates 22b to improve heat exchange efficiency and strength.

The electronic component case for the vehicle may further include a coolant inflow port 31 and a coolant discharge port 32.

The coolant inflow port 31 is disposed on the coolant inflow hole 11 and connected to an external coolant supply source (not shown) to allow the coolant supply source (not shown) to communicate with the second space 13.

The coolant discharge port 32 is disposed on the coolant discharge hole 12 and connected to an external coolant collecting source (not shown) to allow the coolant collecting source (not shown) to communicate with the second space 13. The electronic component case for the vehicle may further include a stopper 33 inserted to each of the coolant inflow hole 11 and the coolant discharge hole 12 to seal the second space 13 from the outside.

A function of the stopper 33 will be described later. Since the coolant introduced into the coolant inflow port 31 has a temperature less than that of the coolant discharged through the coolant discharge port 32, the electronic components having a relatively large amount of heat dissipation are disposed adjacent to the coolant inflow hole 11, and the electronic components having a relatively small amount of heat dissipation are disposed adjacent to the coolant discharge hole 12, thereby improving heat exchange efficiency.

Hereinafter, a method in which the first cover 21 and the second cover 22 are compatibly used will be described.

Referring to FIG. 2, if an electronic component case for an air-cooling type vehicle is needed, the second cover 22 may be disposed on the case body 10. In this case, the second space 13 of the case body 10 is filled with the coolant, and the stopper 33 blocks each of the coolant inflow hole 11 and the coolant discharge hole 12 to restrict a flow of the coolant. Therefore, heat generated from the electronic components may be released to the outside through the second cover 22 via the coolant.

Alternatively, the second space 13 is not filled with the coolant, and one surface of the second cover 22 facing the second space 13 may be in direct-contact with the inner plate 40. In this case, thermal grease may be applied to a portion of the second cover 22 of which the other surface is in contact with the inner plate 40.

On the other hand, if an electronic component case for a water-cooling type vehicle is needed, the first cover 21 may be disposed on the case body 10. In this case, the coolant introduced into the second space 13 through the coolant inflow hole 11 from the outside absorbs the heat from the electronic components, and then the coolant is discharged through the coolant discharge hole 12 to the outside.

Here, the coolant inflow port 31 and the coolant discharge port 32 are installed to the coolant inflow hole 11 and the coolant discharge hole 12, respectively. Also, the coolant inflow port 31 and the coolant discharge port 32 are connected to the coolant supplying source and the coolant collecting source, respectively.

Additionally, if the electronic component case for the water-cooling type vehicle is needed, the second cover 22 may be disposed on the case body 10. In this case, the electronic components may be cooled through all the coolant and air to more improve cooling efficiency for the electronic components.

The electronic component case for the vehicle according to an embodiment may be applied to the water-cooling method for cooling the electronic components by using the coolant and air-cooling method for cooling the electronic components by using the air according to the cooling types of the vehicles.

Thus, the electronic component case for the vehicle may effectively deal with a change in design of the vehicles. Therefore, the electronic component case may be shortened in development period and reduced in development costs.

Also, since the air-cooling method and the water-cooling method are simultaneously applied to the electronic component case for the vehicle, the electric component case may improve the cooling efficiency for the electronic components.

Later, has been described as an embodiment to configure all the components are combined into one, or working in conjunction, the present disclosure is not necessarily limited to these embodiments. In other words, the object of the embodiment is within the range, if all components optionally combined with one or more may work. In addition, other components listed above, the term "including", "configuration" or "having", which means not specifically mention the opposite, the components may be inherent, so to exclude but also can include other components that should be interpreted. All terms, including technical and scientific terms that are generally understood by those of ordinary skill in the art, the present disclosure pertains, unless otherwise defined, shall have the same meaning. Such as the commonly used terms defined in advance, unless clearly defined in the present disclosure, the term shall be construed to be consistent with their meaning in the context of related technologies, and overly idealistic or not be construed as a formal sense.

If a person of ordinary skill in the art to which this invention pertains without departing from the essential characteristics of the embodiments in the range described above, is only the spirit of the embodiments have been described for illustrative purposes, various modifications, additions and substitutions are possible. Therefore, to explain the embodiments disclosed in the present disclosure is not limited to the technical idea of the embodiments, and are not limited by this embodiments, the spirit of the scope The scope of protection of the present disclosure, all the technical idea, within the scope of its equivalent shall be construed by the following claims should be construed as being included in the scope of the present disclosure.

What is claimed is:

1. An electronic component case for a vehicle, the electronic component case comprising:
    a case body having a first space in which electronic components are disposed and a second space that is defined adjacent to the first space to receive heat generated from the electronic components and into which coolant for cooling the electronic components is introduced and discharged; and
    a cover disposed on the case body to seal the second space,
    wherein the cover comprises a first cover and a second cover sealing the second space, the second cover having one surface on which a first cooling part for increasing a surface area of the second cover is disposed,
    wherein the first cover and the second cover are compatible with each other,
    wherein the first and second spaces are partitioned by an inner plate on which the electronic components are disposed,
    wherein a surface of the second cover that faces the second space is in contact with the inner plate when the second cover is disposed on the case body.

2. The electronic component case according to claim 1, wherein:
    the first cover is disposed on the case body when the coolant is introduced into and discharged from the second space; and
    the second cover is disposed on the case body when the coolant is not introduced into and discharged from the second space.

3. The electronic component case according to claim 2, wherein the cover is formed of aluminum or iron.

4. The electronic component case according to claim 1, wherein the first cooling part comprises a plurality of pins.

5. The electronic component case according to claim 2, wherein the first cooling part comprises a plurality of plates.

6. The electronic component case according to claim 1, wherein the case body further has a coolant inflow hole through which the coolant is introduced into the second space and a coolant discharge hole through which the coolant is discharged from the second space.

7. The electronic component case according to claim 6, further comprising a stopper inserted into each of the coolant inflow hole and the coolant discharge hole to seal the second space externally when the second cover is disposed on the case body.

8. The electronic component case according to claim 7, wherein the second space is filled with the coolant.

9. The electronic component case according to claim 1, further comprising a first sealer provided on an edge of the cover and compressed by the case body when the cover is disposed on the case body.

10. The electronic component case according to claim 1, wherein a second cooling part is disposed on a surface of the inner plate that faces the second space.

11. The electronic component case according to claim 10, wherein the second cooling part comprises a plurality of pins.

12. The electronic component case according to claim 1, wherein thermal grease is applied to a portion of the second cover of which a surface is in contact with the inner plate.

* * * * *